(12) United States Patent
Campbell et al.

(10) Patent No.: US 10,164,587 B2
(45) Date of Patent: Dec. 25, 2018

(54) ELECTRONICALLY RECONFIGURABLE MATCHING NETWORK

(71) Applicant: Qorvo US, Inc., Greensboro, NC (US)

(72) Inventors: Charles Forrest Campbell, Allen, TX (US); Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/802,117

(22) Filed: Nov. 2, 2017

(65) Prior Publication Data

US 2018/0123533 A1    May 3, 2018

Related U.S. Application Data

(60) Provisional application No. 62/416,777, filed on Nov. 3, 2016.

(51) Int. Cl.
*H03F 3/191* (2006.01)
*H03F 1/56* (2006.01)
(Continued)

(52) U.S. Cl.
CPC .......... *H03F 1/565* (2013.01); *H03F 3/195* (2013.01); *H03F 3/213* (2013.01); *H03F 2200/423* (2013.01); *H03F 2200/451* (2013.01)

(58) Field of Classification Search
CPC ...................................................... H03F 3/191
(Continued)

(56) References Cited

U.S. PATENT DOCUMENTS

| 7,541,875 B2 * | 6/2009 | Taylor ............... H03F 1/223 330/133 |
| 7,911,279 B2 * | 3/2011 | Chow ............... H03F 1/223 330/296 |

(Continued)

OTHER PUBLICATIONS

Bell, Patrick, et al., "MEMS-Switched Class-A-to-E Reconfigurable Power Amplifier," Radio and Wireless Symposium, Oct. 17-19, 2006, San Diego, California, IEEE, pp. 243-246.
(Continued)

*Primary Examiner* — Henry Choe
(74) *Attorney, Agent, or Firm* — Withrow & Terranova, P.L.L.C.

(57) ABSTRACT

An electronically reconfigurable matching network having a plurality of electronically reconfigurable components is disclosed. Each of the plurality of electronically reconfigurable elements includes a plurality of selectable impedance elements coupled together. Each selectable impedance element includes an impedance element coupled between first and second end terminals and a field-effect transistor (FET)-based switch coupled between the first and second end terminals. The FET-based switch includes a first FET having first and second current terminals coupled to a first gate terminal and a second FET having a third current terminal coupled to the first gate terminal, a fourth current terminal, and a second gate terminal coupled to a first control terminal; and a third FET having a fifth current terminal coupled to the first end terminal, a sixth current terminal coupled to the second end terminal, and a third gate terminal coupled to the third current terminal.

22 Claims, 11 Drawing Sheets

DRAIN VOLTAGE CONNECTED SWITCH (51) Int. Cl.
*H03F 3/213* (2006.01)
*H03F 3/195* (2006.01)

(58) Field of Classification Search
USPC .................................................. 330/302, 311
See application file for complete search history.

(56) References Cited

U.S. PATENT DOCUMENTS

| | | | | |
|---|---|---|---|---|
| 8,493,154 | B1* | 7/2013 | Camargo | H03F 1/223 |
| | | | | 330/296 |
| 8,779,859 | B2* | 7/2014 | Su | H03F 3/193 |
| | | | | 330/311 |
| 2004/0085130 | A1* | 5/2004 | Luo | H03F 1/20 |
| | | | | 330/288 |
| 2009/0085664 | A1* | 4/2009 | Yang | H03F 1/0261 |
| | | | | 330/277 |

OTHER PUBLICATIONS

Fukuda, Atsushi, et al., "A 0.9-5-GHz Wide-Range 1W-Class Reconfigurable Power Amplifier Employing RF-MEMS Switches," Microwave Symposium Digest, Jun. 11-16, 2006, San Francisco, California, IEEE, pp. 1859-1862.

Kim, Unha, et al., "A Multiband Reconfigurable Power Amplifier for UMTS Handset Applications," IEEE Transactions on Microwave Theory and Techniques, vol. 60, Issue 8, Aug. 2012, IEEE, pp. 2532-2542.

Chlieh, O.L., et al., "Microfluidically Reconfigurable GaN Power Amplifier on Multilayer Organic Substrate for S-Band and C-Band Applications," MTT-S International Microwave Symposium, 2015, IEEE, 4 pages.

Quach, T., et al., "Frequency -agile and Power Scalable Power Amplifier for Multi-band Telemetry Applications," The ITEA Journal of Test and Evaluation, vol. 37, Issue 4, Dec. 2016, The International Test and Evaluation Association, pp. 342-351.

* cited by examiner

ELECTRONICALLY RECONFIGURABLE MATCHING NETWORK

RELATED APPLICATIONS

This application claims the benefit of provisional patent application Ser. No. 62/416,777, filed Nov. 3, 2016, the disclosure of which is hereby incorporated herein by reference in its entirety.

FIELD OF THE DISCLOSURE

The present disclosure relates to an electronically reconfigurable matching network for radio frequency power amplifiers.

BACKGROUND

A number of military and commercial applications require power amplifiers that operate in multiple, relatively narrow frequency bands with greatly differing center frequencies. For example, many radar systems operate with 10% to 20% bandwidth and center frequencies at L-band, S-band, X-band, and Ku-band. A high level of amplifier performance is required within the narrow operating bands but not outside of these bands. For example, an S-band/X-band system might operate at 3.0 to 3.5 GHz and 10.5 to 12.0 GHz, respectively. Operation below 3.0 GHz, above 12.0 GHz, and between 3.5 GHz and 10.5 GHz is not required.

To cover both of these bands with a single amplifier requires a wideband power amplifier, switched S/X-band amplifiers, or an amplifier tuned for two separate frequency bands. Wideband amplifier monolithic microwave integrated circuits do exist; however, they exhibit a significantly lower level of performance compared with amplifiers tuned to the individual bands and are difficult to scale to higher output power levels. Radio frequency switching between individual amplifiers that have been optimized for each frequency range requires a large amount of semiconductor real estate (two high-power amplifiers and two switches) and suffers reduced performance because of the insertion loss of the radio frequency switches.

Past efforts to develop amplifiers tuned at multiple bands have not been successful. Reasons for this inferior performance are that for both the wideband and multi-band power amplifiers, the circuitry typically employed has a significant amount of gain and output power that is outside of the operating bands being targeted and thus creates a potentially undesirable out-of-band noise emission, undesirable harmonic levels, and amplifier stability issues. What is needed is circuitry that is electronically reconfigurable such that an amplifier may be tuned for operation in multiple bands without creating the potentially undesirable out-of-band noise emission, undesirable harmonic levels, and amplifier stability issues.

SUMMARY

An electronically reconfigurable matching network for power amplifiers is disclosed. The electronically reconfigurable matching network has a plurality of electronically reconfigurable components coupled in series in a power path between a first port and a second port. Each of the plurality of electronically reconfigurable elements includes a plurality of selectable impedance elements coupled together. Each of the selectable impedance elements includes an impedance element coupled between a first end terminal and a second end terminal and a field-effect transistor (FET)-based switch coupled between the first end terminal and the second end terminal. The FET-based switch includes a first FET having a first current terminal, a first gate terminal, and a second current terminal coupled to the first gate terminal. A second FET has a third current terminal coupled to the first gate terminal, a fourth current terminal, and a second gate terminal coupled to a first control terminal. A third FET has a fifth current terminal coupled to the first end terminal, a sixth current terminal coupled to the second end terminal, and a third gate terminal coupled to the third current terminal, wherein the first end terminal and the second end terminal are configured to receive a portion of radio frequency power from the power path.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
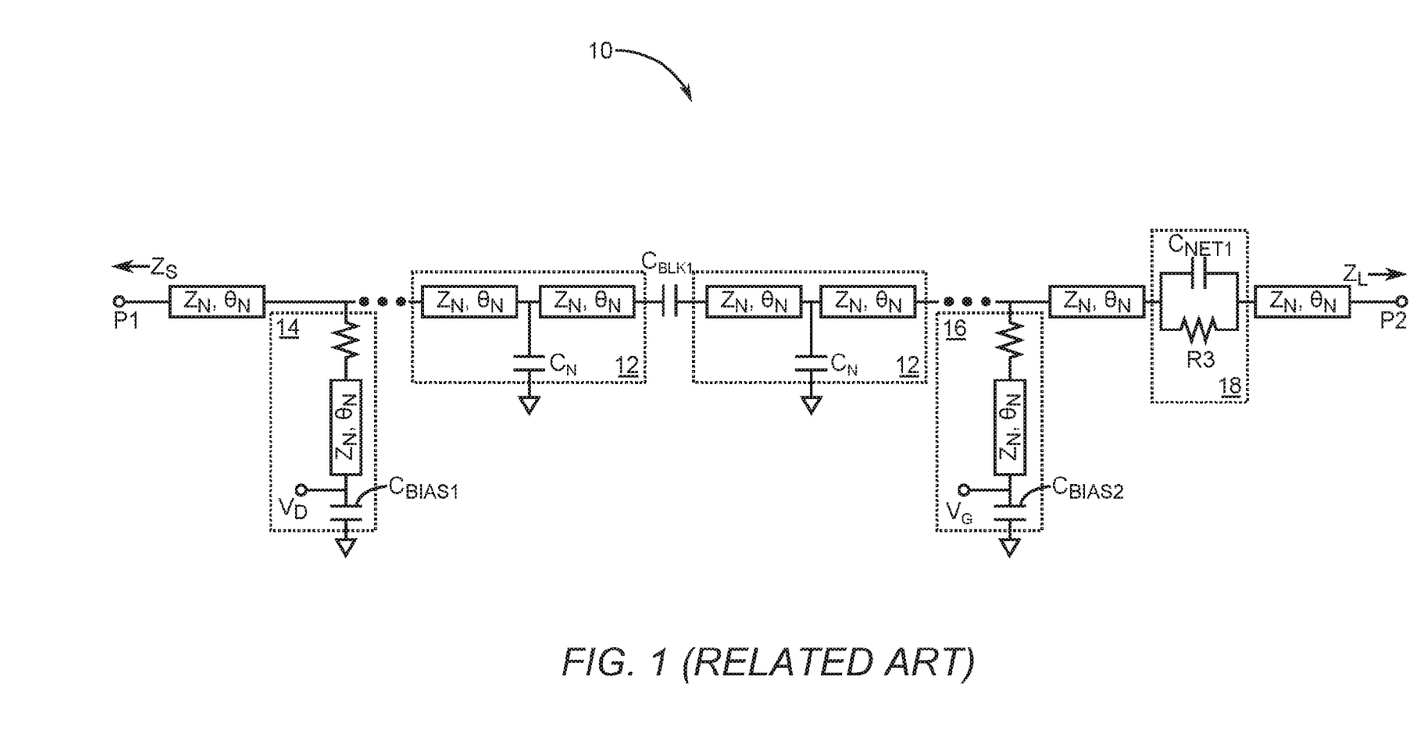
FIG. 1 is a schematic that depicts a related-art topology of a generalized power amplifier matching network.

FIG. 1 is a related-art topology of a generalized power amplifier matching network 10. An N number of matching inductor-capacitor (LC) sections 12 are depicted to the left and the right of a direct current (DC) blocking capacitor $C_{BLK1}$. The LC sections 12 are made up of impedance elements ($Z_N$, $\theta_N$) and a capacitor $C_N$ arranged in a T configuration. The number N of the matching LC sections 12 is a function of the source/load impedances, center frequency, and amplifier bandwidth. The impedance elements ($Z_N$, $\theta_N$) employed throughout the generalized power amplifier matching network 10 may be realized as microstrip transmission lines.

The generalized power amplifier matching network 10 also includes a drain bias tee 14 and a gate bias tee 16. The drain bias tee 14 is located near a first port P1 that sees a source impedance $Z_S$. The drain bias tee 14 includes a first resistor R1 coupled in series with one of the impedance elements ($Z_N$, $\theta_N$) and a first bias capacitor $C_{BIAS1}$. A drain voltage $V_D$ that is direct current is applied at a node between the impedance element ($Z_N$, $\theta_N$) and the first bias capacitor $C_{BIAS1}$.

The gate bias tee 16 is located near a second port P2 that sees a load impedance $Z_L$. The gate bias tee 16 includes a second resistor R2 coupled in series with another one of the impedance elements ($Z_N$, $\theta_N$) and a second bias capacitor $C_{BIAS2}$. A gate voltage $V_G$ that is direct current is applied at a node between the impedance element ($Z_N$, $\theta_N$) and the second bias capacitor $C_{BIAS2}$.

A gain equalization and stability network 18 is located between the gate bias tee 16 and the second port P2. The gain equalization and stability network 18 is made up of a parallel coupled third resistor R3 and a capacitor $C_{NET1}$.

Figure 2:
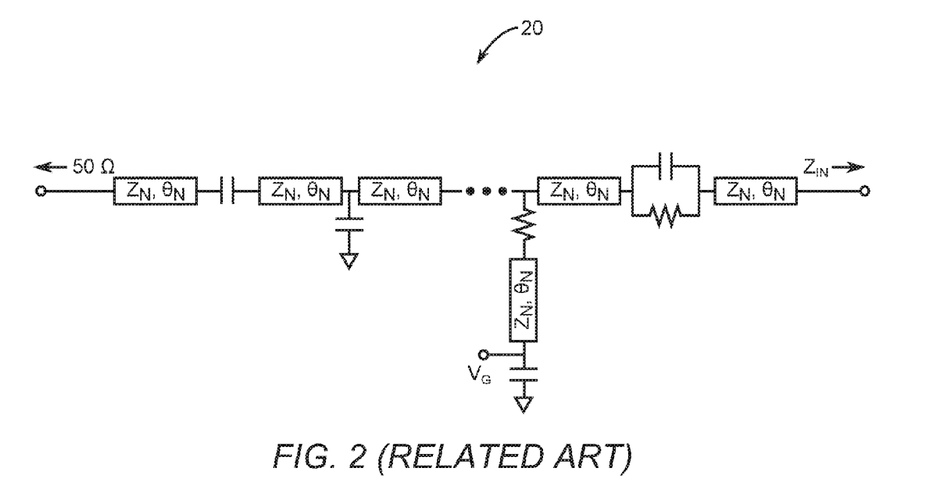
FIG. 2 is a schematic that depicts an input matching network derived from the related-art topology of the generalized power amplifier matching network of FIG. 1.
Figure 3:
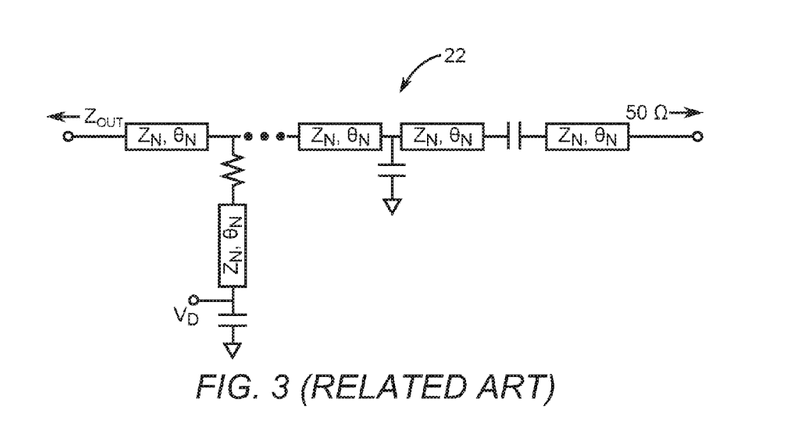
FIG. 3 is a schematic that depicts an output matching network derived from the related-art topology of the generalized power amplifier matching network of FIG. 1.

The generalized power amplifier matching network 10 of FIG. 1 is usable as an interstage matching network. However, the generalized power amplifier matching network 10 may be split apart to realize an input matching network 20 depicted in FIG. 2 and an output matching network 22 depicted in FIG. 3. However, it is to be understood that the generalized power amplifier matching network 10 need not be split apart. Rather it is only necessary to set appropriate component values that practically approach zero and practically approach infinity. Both the input matching network 20 and the output matching network 22 are realizable for providing impedance matching for power amplifiers that are implemented as monolithic microwave integrated circuits (MMICs).

Figure 4:
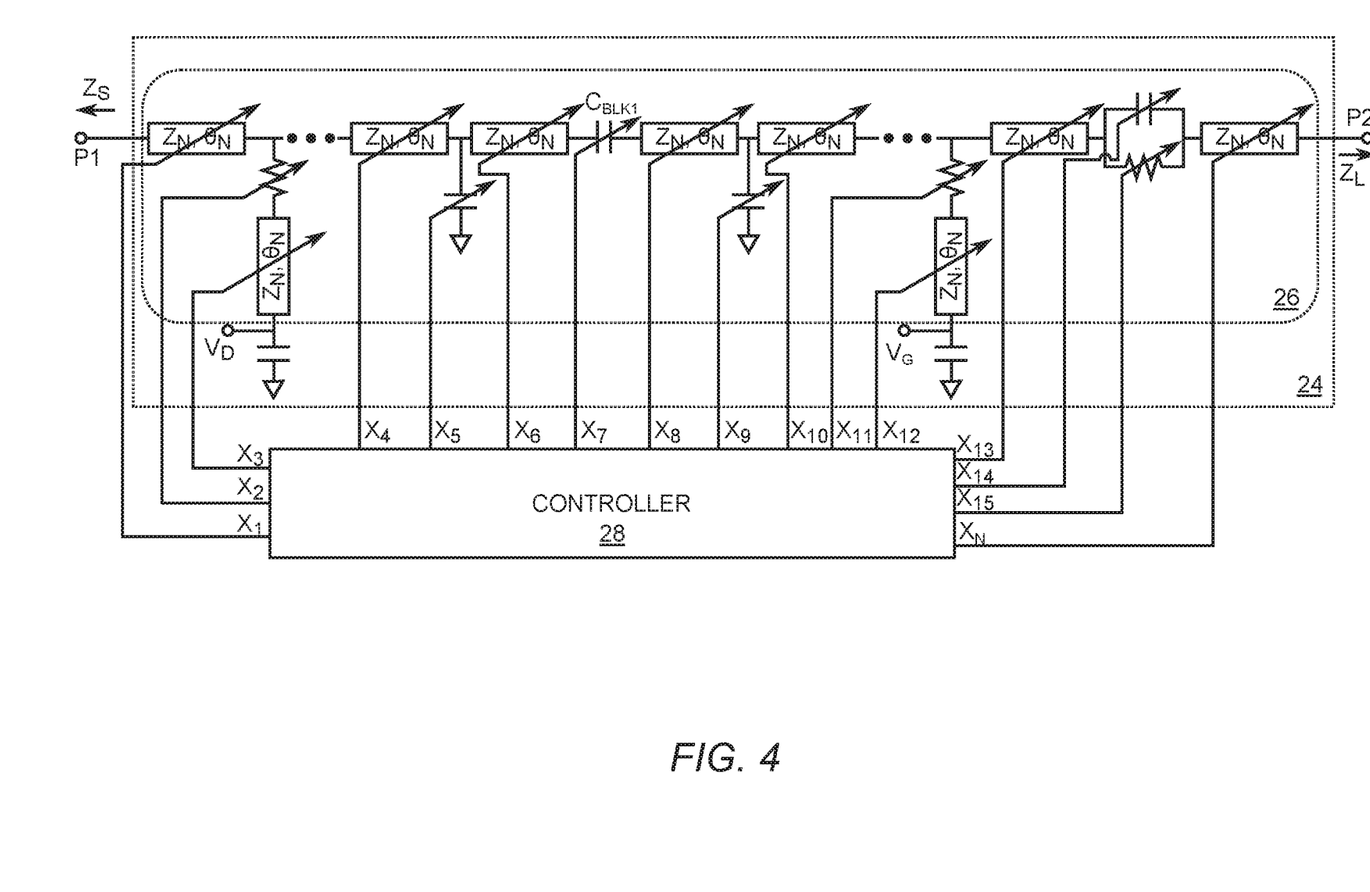
FIG. 4 is a schematic that depicts an electronically reconfigurable matching network that is configured in accordance with the present disclosure.

FIG. 4 is a schematic of an electronically reconfigurable matching network 24 that is configured in accordance with the present disclosure. The electronically reconfigurable matching network 24 is configured for integration as a MMIC. Each one of a plurality of electronically reconfigurable components 26 making up the electronically reconfigurable matching network 24 is denoted as having an electronically selectable impedance value by an arrow placed diagonally across a symbol representing individual ones of the plurality of electronically reconfigurable components 26. A controller 28 has outputs $X_1$-$X_N$ that are coupled to the electronically reconfigurable components 26, where N is a finite counting number. In the exemplary embodiment of FIG. 4, there is one output for each of the plurality of electronically reconfigurable components 26.

Control signals from the controller and transmitted to the electronically reconfigurable components 26 through the outputs $X_1$-$X_N$ select individual impedance values for each of the plurality of electronically reconfigurable components 26. The controller 28 is preprogrammed to select appropriate impedance values for the plurality of electronically reconfigurable components 26 for properly matching source impedance $Z_S$ as seen by the first port P1 and load impedance $Z_L$ as seen by the second port P2 based upon a desired band of operation that has a predetermined bandwidth and center frequency. For example, the source impedance $Z_S$ and load impedance $Z_L$ to a power amplifier (not shown) may be matched for conditions of 10% to 20% bandwidth with center frequencies at L-band, S-band, X-band, and Ku-band. In general, the electronically reconfigurable matching network 24 is configured to be electronically reconfigurable to match source impedance $Z_S$ and load impedance $Z_L$ over at least one octave of bandwidth while operating between 2 GHz and 14 GHz.

Figure 5:
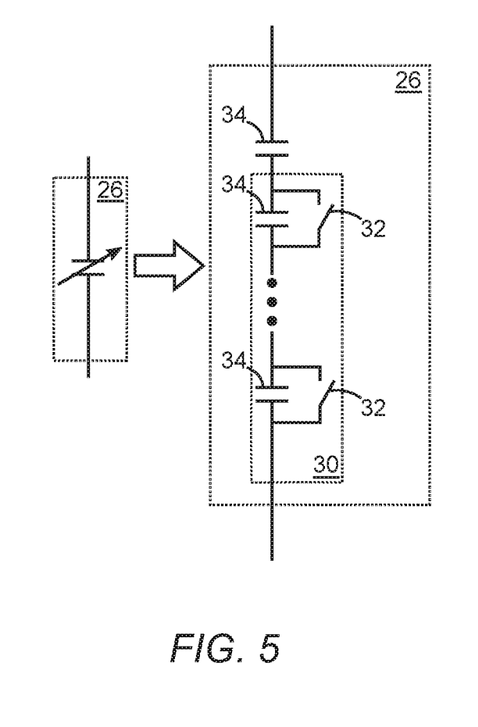
FIG. 5 is a depiction of one of the plurality of electronically reconfigurable components that is capacitor based.
Figure 6:
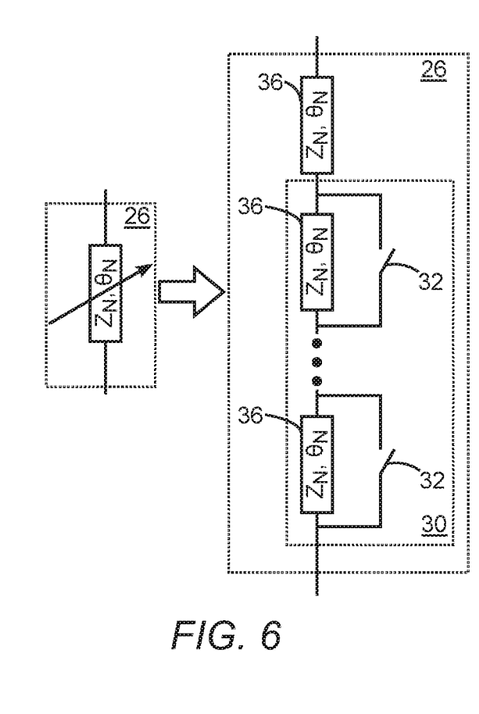
FIG. 6 is a depiction of one of the plurality of electronically reconfigurable components that is a distributed impedance-based element such as a microstrip.
Figure 7:
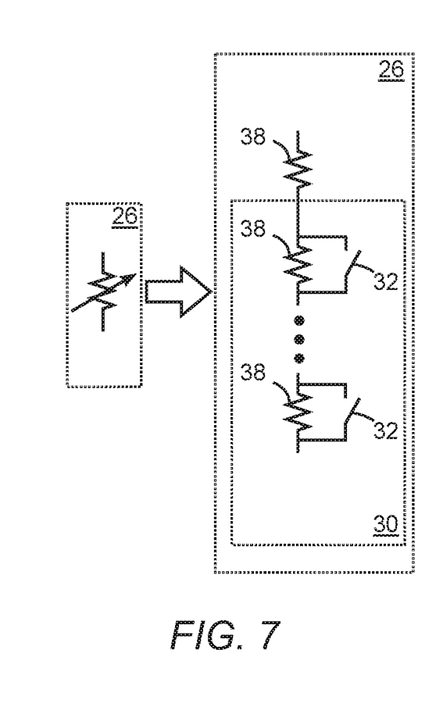
FIG. 7 is a depiction of one of the plurality of electronically reconfigurable components that is resistor based.

As depicted in FIG. 5, FIG. 6, and FIG. 7, each of the plurality of electronically reconfigurable components 26 is made up of a plurality of selectable impedance elements 30 that are coupled together. Each of the plurality of electronically reconfigurable components 26 has a variable impedance value that is adjusted by switching in or out individual impedance elements making up the plurality of selectable impedance elements 30. The number N of the plurality of electronically reconfigurable components 26 needed depends on how many different frequency bands at which an associated amplifier is required to operate. For example, a two-band operation requires just one of the plurality of electronically reconfigurable components 26, whereas a three-band or four-band operation requires at least two of the plurality of electronically reconfigurable components 26.

FIG. 5 is a depiction of one of the plurality of electronically reconfigurable components 26 that is capacitor based. In this capacitor-based embodiment of one of the plurality of electronically reconfigurable components 26, each one of the plurality of selectable impedance elements 30 is made up of a field-effect transistor (FET)-based switch 32 coupled in parallel with a capacitor 34 having a fixed value of capacitance. In at least one embodiment, each of the capacitors 34 is a metal-insulator-metal capacitor. The plurality of selectable impedance elements 30 may be coupled together in various circuit topologies such as an array of series branches coupled in parallel and combinations thereof. Optionally, the plurality of electronically reconfigurable components 26 that is capacitor based may also include capacitors 34 that are not selectable as depicted in FIG. 5 at a top end of the series coupled string of capacitors 34.

The opening and closing of each FET-based switch 32 is controlled by the controller 28 (FIG. 4) by way of an assigned one of the outputs $X_1$-$X_N$ that transmits a digital signal that can, for example, address each FET-based switch 32 and provide an open or close command bit. When one of the FET-based switches 32 is closed, a capacitor that it is coupled across effectively has its capacitance value contribution removed from an addressed one of the plurality of electronically reconfigurable components 26 that is capacitor based. In contrast, when that particular FET-based switch 32 is opened, the capacitor that the particular FET-based switch 32 is coupled across effectively has its capacitance value contribution added to the addressed one of the plurality of electronically reconfigurable components 26 that is capacitor based.

In yet another embodiment, parasitic off-state capacitance $C_{OFF}$ of the FET-based switch 32 by itself makes up one of the plurality of electronically reconfigurable components 26. The parasitic off-state capacitance $C_{OFF}$ of the FET-based switch 32 is usable as a tuning capacitance for the electronically reconfigurable matching network 24 and in particular for tuning the gain equalization and stability network 18 (FIG. 1).

In operation, the parasitic off-state capacitance $C_{OFF}$ of the FET-based switch 32 does not contribute as an impedance matching element of the electronically reconfigurable matching network 24 when the FET-based switch 32 is in the on-state. In contrast, the parasitic off-state capacitance $C_{OFF}$ of the FET-based switch 32 does contribute as an impedance matching element of the electronically reconfigurable matching network 24 when the FET-based switch 32 is in the off-state. A benefit of employing the FET-based switch 32 by itself as one the plurality of electronically reconfigurable components 26 that is capacitor-based is that the working voltage is significantly higher than the working voltage for a MMIC-type metal-insulator-metal capacitor. Thus, higher voltage radio frequency (RF) signals may be propagated through the electronically reconfigurable matching network 24 that employs the parasitic off-state capacitance $C_{OFF}$ of the FET-based switch 32 as one of the plurality of electronically reconfigurable components 26.

FIG. 6 is a depiction of one of the plurality of electronically reconfigurable components 26 that is distributed impedance based. In this distributed impedance-based embodiment of one of the plurality of electronically reconfigurable components 26, each one of the plurality of selectable impedance elements 30 is made up of the FET-based switch 32 coupled in parallel with a distributed impedance-based element 36. In at least one embodiment, the distributed impedance-based element 36 is a transmission line segment such as a microstrip. One type of microstrip is made up of an electrically conductive strip separated from a ground plane by a substrate made of a dielectric material. Dimensions of the microstrip such as length and width of the electrically conductive strip, along with the thickness and dielectric constant of the substrate, contribute to the value of impedance provided by the microstrip. Similar to the plurality of selectable impedance elements 30 made up of the capacitors 34, the plurality of selectable impedance elements 30 made up of distributed impedance-based elements 36 may be coupled together in various circuit topologies such as an array of series branches that are coupled in parallel and combinations thereof. Optionally, the plurality of electronically reconfigurable components 26 that is distributed impedance based may also include distributed impedance-based elements 36 that are not selectable as depicted in FIG. 6 at a top end of the series coupled string of distributed impedance-based elements 36.

During operation when the FET-based switch 32 is closed, the distributed impedance-based element 36 that the FET-based switch 32 is coupled across effectively has its impedance contribution removed from the plurality of selectable impedance elements 30. In contrast, when the FET-based switch 32 is opened, the distributed impedance-based element 36 that the FET-based switch 32 is coupled across effectively has its impedance value contribution added to the plurality of selectable impedance elements 30.

FIG. 7 is a depiction of one of the plurality of electronically reconfigurable components 26 that is resistor based. In this resistor-based embodiment of one of the plurality of electronically reconfigurable components 26, each one of the plurality of selectable impedance elements 30 is made up of the FET-based switch 32 coupled in parallel with a resistor 38.

During operation when the FET-based switch 32 is closed, the resistor 38 that the FET-based switch 32 is coupled across effectively has its resistance contribution removed from the plurality of selectable impedance elements 30. In contrast, when the FET-based switch 32 is opened, the resistor 38 that the FET-based switch 32 is coupled across effectively has its resistance value contribution added to the plurality of selectable impedance elements 30.

In one embodiment, each resistor 38 is a thin-film resistor. Similar to the plurality of selectable impedance elements 30 made up of the capacitors 34 or the distributed impedance-based elements 36, the plurality of selectable impedance elements 30 made up of resistors 38 may be coupled together in various circuit topologies such as an array of series branches that are coupled in parallel and combinations thereof. Optionally, the plurality of electronically reconfigurable components 26 that is capacitor based may also include resistors 38 that are not selectable as depicted in FIG. 7 at a top end of the series coupled string of resistors 38.

In yet another embodiment, on-state resistance $R_{ON}$ of the FET-based switch 32 by itself makes up one of the plurality of electronically reconfigurable components 26. In operation, the on-state resistance $R_{ON}$ of the FET-based switch 32 contributes as an impedance matching element of the electronically reconfigurable matching network 24 when the FET-based switch 32 is in the on-state. In contrast, the on-state resistance $R_{ON}$ of the FET-based switch 32 does not contribute as an impedance matching element of the electronically reconfigurable matching network 24 when the FET-based switch 32 is in the off-state.

Figure 8:
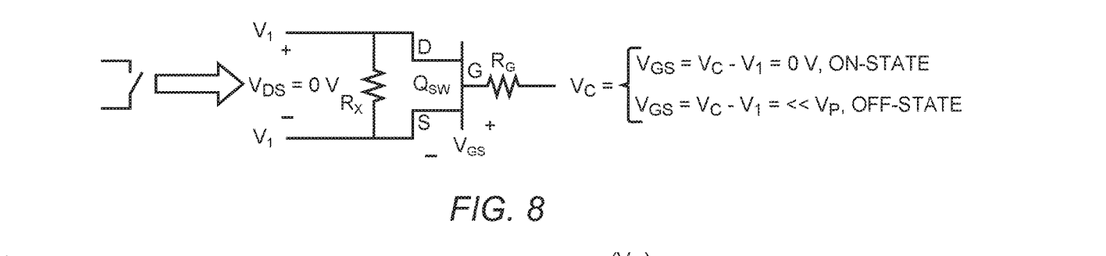
FIG. 8 is a depiction of a field-effect transistor (FET) operated as a switch illustrating terminal voltages necessary for switching conditions for the FET-based switches employed by the electronically reconfigurable matching network 24 of the present disclosure.

FIG. 8 is a depiction of a FET $Q_{SW}$ operated as a switch illustrating terminal voltages necessary for switching conditions for the FET-based switch 32 employed by the electronically reconfigurable matching network 24 of the present disclosure. The FET $Q_{SW}$ is usable as a switch to open and close across a resistor $R_X$. When the FET is in either of an on-state or an off-state, a drain (D)-to-source (S) voltage $V_{DS}$ is equal to zero. The resistor $R_X$ forces $V_{DS}$ to 0 V for both the on-state and the off-state and is not always needed. A resistance value of $R_X$ is set intentionally large enough so as not to affect operation and is not a reconfigurable element. When the FET $Q_{SW}$ is in an on-state, the resistor $R_X$ is shunted.

A control bias voltage $V_C$ is applied to a gate G of the FET $Q_{SW}$ by way of a high-value resistance resistor $R_G$. To bias the switch FET in the on-state, the control voltage $V_{GS}$ is set equal to 0 V. To bias the FET in the off-state, the control voltage $V_{GS}$ is set to a voltage relatively much more negative than the pinch-off voltage $V_P$ for the FET. In exemplary embodiments, the control voltage $V_{GS}$ is set equal to between −25 V and −50 V depending on a desired off-state RF power handling and breakdown voltage for the process. For typical RF control components such as switches, phase shifters, and attenuators, voltage $V_1$ and control bias voltage $V_C$ are set to 0 V to place the FET into the on-state, and control bias voltage $V_C$ is set to between −25 V and −50 V to place the FET into the off-state. If certain ones of the plurality of electronically reconfigurable components 26 have a number of the FET-based switches 32 simultaneously in different states, then two control signal voltages $V_{C1}$ and $V_{C2}$ that are complementary are used to control the state of the FET-based switches 32.

The FET-based switches 32 included in the plurality of electronically reconfigurable components 26 of the electronically reconfigurable matching network 24 and depicted schematically in FIGS. 5-7 detailing various forms of the plurality of electronically reconfigurable components 26 have an important fundamental difference over FETs used in a typical control circuit. The voltage $V_1$ is equal to the drain voltage $V_D$ for switch FETs employed in individual ones of the plurality of electronically reconfigurable components 26 to the left of the DC blocking capacitor $C_{BLK1}$ in the electronically reconfigurable matching network 24. As such, switch FETs employed in individual ones of the plurality of electronically reconfigurable components 26 to the left of the DC blocking capacitor $C_{BLK1}$ in the electronically reconfigurable matching network 24 are referred to as drain-connected switch FETs. Switch FETs to the right of the DC blocking capacitor $C_{BLK1}$ in the electronically reconfigurable matching network 24, where voltage $V_1$ is equal to gate voltage $V_G$, and are referred to as gate-connected switch FETs. Drain- and gate-connected switch FETs require different values of control bias voltage $V_C$ to properly switch. For example, if the power amplifier drain voltage $V_D$=20 V, then control bias voltage $V_C$ needs to be equal to at least 20 V to place the FET into the on-state and needs to be between −5 V and −30 V to place the FET into the off-state. Recall that industry standard control voltages for gallium nitride (GaN) control components are $V_C$=0 V for the on-state and between −25 V and −50 V for the off-state. Drain-connected switch FETs need a bi-polar control voltage that requires custom interface circuitry. Similarly, gate-connected switch FETs require $V_C$−$V_G$ for the on-state and $V_C$−$V_G$ that is between −25 V and −50 V for the off-state. To complicate matters further, the gate bias voltage $V_G$ is typically individually set for each amplifier MMIC to produce a specific level of quiescent drain bias current. In other words, gate voltage $V_G$ is not known a priori and varies from one amplifier MMIC to another amplifier MMIC. Four separate control voltages, custom adjusted for gate voltage $V_G$ and drain voltage $V_D$ are required to reconfigure the amplifier MMIC. If the application used large numbers of amplifier MMICs (e.g., phased array radar), routing four separate custom-adjusted control voltages to each of the amplifier MMICs would be highly problematic and undesirable. One solution to this problem is to place DC blocking capacitors $C_{BLK1}$ in series with the source and drain of every switch FET. This, however, is not feasible for a monolithic implementation because the blocking capacitors need to be excessively large so as not to interfere with the RF operation of the amplifier MMIC. Switch circuits of the present disclosure depicted schematically in FIGS. 9 and 10 rectify these problems. The switch circuits use voltages $V_G$, $V_D$, $V_{C1}$, and $V_{C2}$ that are typically available for bias circuits on amplifier MMICs to produce appropriate voltage levels to control the on-state and the off-state of both gate-connected switch FETs and drain-connected switch FETs.

Figure 9:
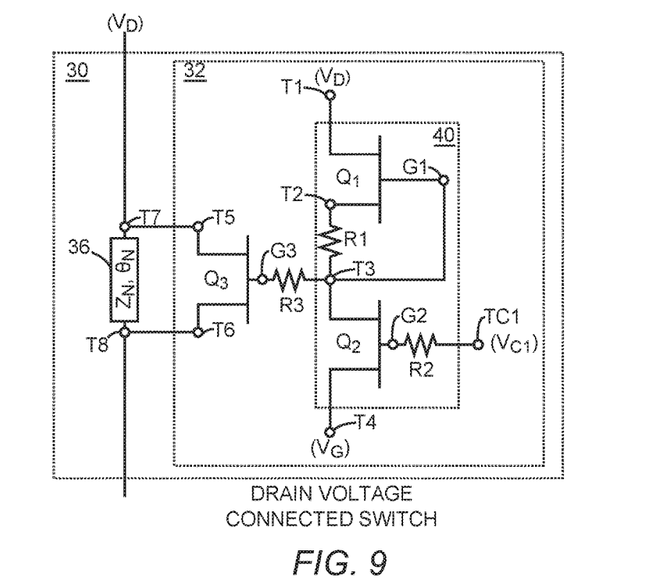
FIG. 9 is a detailed depiction of the FET-based switch that is structured in accordance with the present disclosure to select or deselect the impedance contribution of impedance elements making up individual ones of the plurality of selectable impedance elements.

FIG. 9 is a detailed depiction of the FET-based switch 32 that is structured in accordance with the present disclosure to select or deselect the impedance contribution of impedance elements making up individual ones of the plurality of selectable impedance elements 30. The FET-based switch 32 includes a first FET Q1 and a second FET Q2 that make up a driver stage 40 that is configured to transition a third FET Q3 from an off-state to an on-state and vice versa in response to at least one switching signal. The first FET Q1 has a first current terminal T1, a first gate terminal G1, and a second current terminal T2. The first gate terminal is coupled to the second current terminal, and in this exemplary embodiment, the first gate terminal T1 is coupled to the second current terminal T2 through a first resistor R1. The second FET Q2 has a third current terminal T3, a fourth current terminal T4, and a second gate terminal G2. A second resistor R2 may be coupled between the second gate terminal G2 and a first control terminal TC1. The third FET Q3 has a fifth current terminal T5, a sixth current terminal T6, and a third gate terminal G3. The first gate terminal G1 and the third current terminal T3 are coupled to the third gate terminal G3. In this exemplary embodiment, the third gate terminal G3 is coupled to the first gate terminal G1 and the third current terminal T3 through a third resistor R3. The fifth terminal T5 is coupled to a first end terminal T7 of an impedance element, which in this exemplary case is one of the distributed impedance-based elements 36. A sixth current terminal T6 is coupled to a second end terminal T8. It is to be understood that the impedance element may also be one of the capacitors 34 or one of the resistors 38 as depicted in FIG. 10.

In the exemplary embodiment of FIG. 9, the FET-based switch 32 is configured as a drain-connected switch FET. As such, the first current terminal T1 is connected to a drain voltage $V_D$, whereas the first control terminal TC1 is connected to a first control signal voltage $V_{C1}$ and the fourth current terminal T4 is connected to a gate voltage $V_G$.

Figure 10:
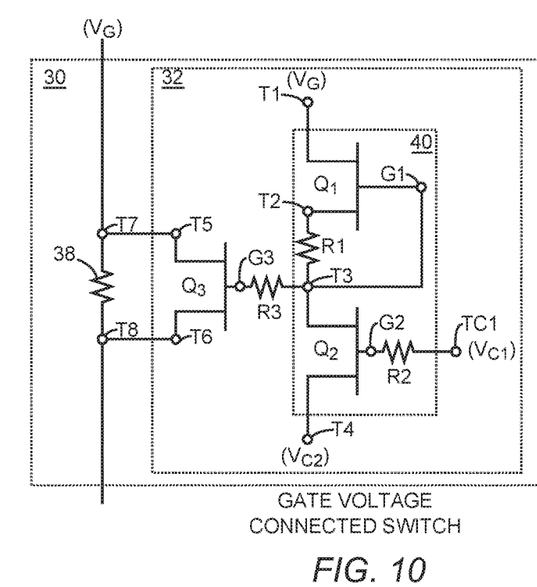
FIG. 10 is a depiction of a gate-connected FET-based switch that is structured in accordance with the present disclosure to select or deselect the impedance contribution of impedance elements making up individual ones of the plurality of selectable impedance elements.

In the exemplary embodiment of FIG. 10, the FET-based switch 32 is configured as a gate-connected switch FET. As such, the first current terminal T1 is connected to the gate voltage $V_G$, whereas the first control terminal TC1 is connected to the first control signal voltage $V_{C1}$ and the fourth current terminal T4 is connected to a second control signal voltage $V_{C2}$.

In both of the exemplary embodiments of FIGS. 9 and 10, the drain voltage $V_D$, the gate voltage $V_G$, the first control signal voltage $V_{C1}$ and the second control signal voltage $V_{C2}$ are available on a MMIC into which a plurality of the FET-based switches 32 is integrated. Further still, in at least some exemplary embodiments, the first current terminal T1 is a first drain terminal, the second current terminal T2 is a first source terminal, the third current terminal T3 is a second drain terminal, the fourth current terminal T4 is a second source terminal, the fifth current terminal T5 is a third drain terminal, and the sixth current terminal T6 is a third source terminal.

During an exemplary operation, the FET-based switch 32 of FIG. 9 is considered drain connected and is assumed to have access to a drain voltage $V_D$=25 V, a gate voltage $V_G$=−3 V, a process pinch-off voltage $V_P$ of −4 V, and a first control signal voltage $V_{C1}$ that transitions between 0 V to place the FET-based switch 32 in the off-state and −30 V to place the FET-based switch 32 in the on-state.

For example, when the first control signal voltage $V_{C1}$=−30 V, a gate-to-source voltage $V_{GS}$=−27 V for the second FET Q2. Thus, the second FET Q2 is pinched off because the gate-to-source voltage $V_{GS}$ for the second FET Q2 is more negative than the process pinch-off voltage $V_P$. Therefore, practically no current flows through the first FET Q1 and the second FET Q2. As such, the gate of the third FET Q3 pulls up to the drain voltage $V_D$, which in response places the third FET Q3 in the on-state.

In contrast, when the first control signal voltage $V_{C1}$=0 V, the second FET Q2 is forward biased to draw current through the first FET Q1. However, the first resistor R1 and the second resistor R2 limit the current through the first FET Q1 to a very small amount that is yet still large enough to pull the gate of the third FET Q3 down to approximately the gate voltage $V_G$ that is applied to the fourth current terminal T4. As a result, the third FET Q3 is now biased at a voltage of $V_G - V_D$ = −3 V−25 V = −28 V, which is more than enough negative voltage to place the third FET Q3 in the off-state.

The drain voltage $V_D$ supplying a power amplifier is increased to increase output power of the power amplifier and decreased to decrease output power of the power amplifier. An advantage of the FET-based switch 32 in the drain-connected switch FET configuration is that the FET-based switch 32 is self-correcting for changes in voltage level of the drain voltage $V_D$. Thus, unlike conventional switch control, external voltage level shifting circuitry or real estate-consuming voltage level shifting circuitry is not needed for proper switch control using the FET-based switch 32.

The off-state power handling of the FET-based switch 32 is a function of how negative the first control signal voltage $V_{C1}$ is set. The more negative the first control signal voltage $V_{C1}$, the higher the power handling of the FET-based switch 32 is until device breakdown for the third FET Q3 is encountered. The off-state control voltage level for the first control signal voltage $V_{C1}$ for the FET-based switch 32 in the drain-connected switch FET configuration is equal to $V_{C1} = V_G - V_D$. As the drain voltage $V_D$ is increased to increase amplifier output power, the off-state control voltage level for the first control signal voltage $V_{C1}$ is made to be more negative, thereby increasing the power handling of the FET-based switch 32.

The FET-based switch 32 in the gate-connected switch FET configuration depicted in FIG. 10 does not require bipolar control voltages. For example, when the first control signal voltage $V_{C1}$=−30 V, the source of the second FET Q2 is set to $V_{C2}$=0 V because the two control voltages are complementary. Moreover, when the second FET Q2 has a gate-to-source voltage $V_{GS}$=−30 V and is in pinch off, no current flows in either of the first FET Q1 or the second FET Q2. Thus, the gate voltage $V_G$ is applied to the gate of the third FET Q3, placing the third FET Q3 in the on-state. Note that the driver stage 40 of the FET-based switch 32 automatically provides proper bias to the FET-based switch 32 in the gate-connected switch FET configuration while in the on-state, independent of the value of the gate voltage $V_G$. When first control signal voltage $V_{C1}$=0 V, the second current terminal T2 is set to the second control signal voltage $V_{C2}$=−30 V, thereby forward biasing the second FET Q2, which causes a current draw through the first FET Q1. However, the first resistor R1 and the second resistor R2 limit the current through the first FET Q1 to a relatively very small amount that is yet still large enough to pull the gate of the third FET Q3 down to approximately the second control signal voltage $V_{C2}$ that is applied to the fourth current terminal T4. In response, the third FET Q3 is now biased at the second control signal voltage $V_{C2} - V_G$ = −27 V, which places the third FET Q3 in the off-state and thereby the FET-based switch 32 in the off-state. As alluded to previously, an advantage of either of the drain-connected switch FET or the gate-connected switch FET is that switch control voltages are self-adjusting to power supply voltages such that the switch control voltages track with the drain and gate voltages.

Figure 11:
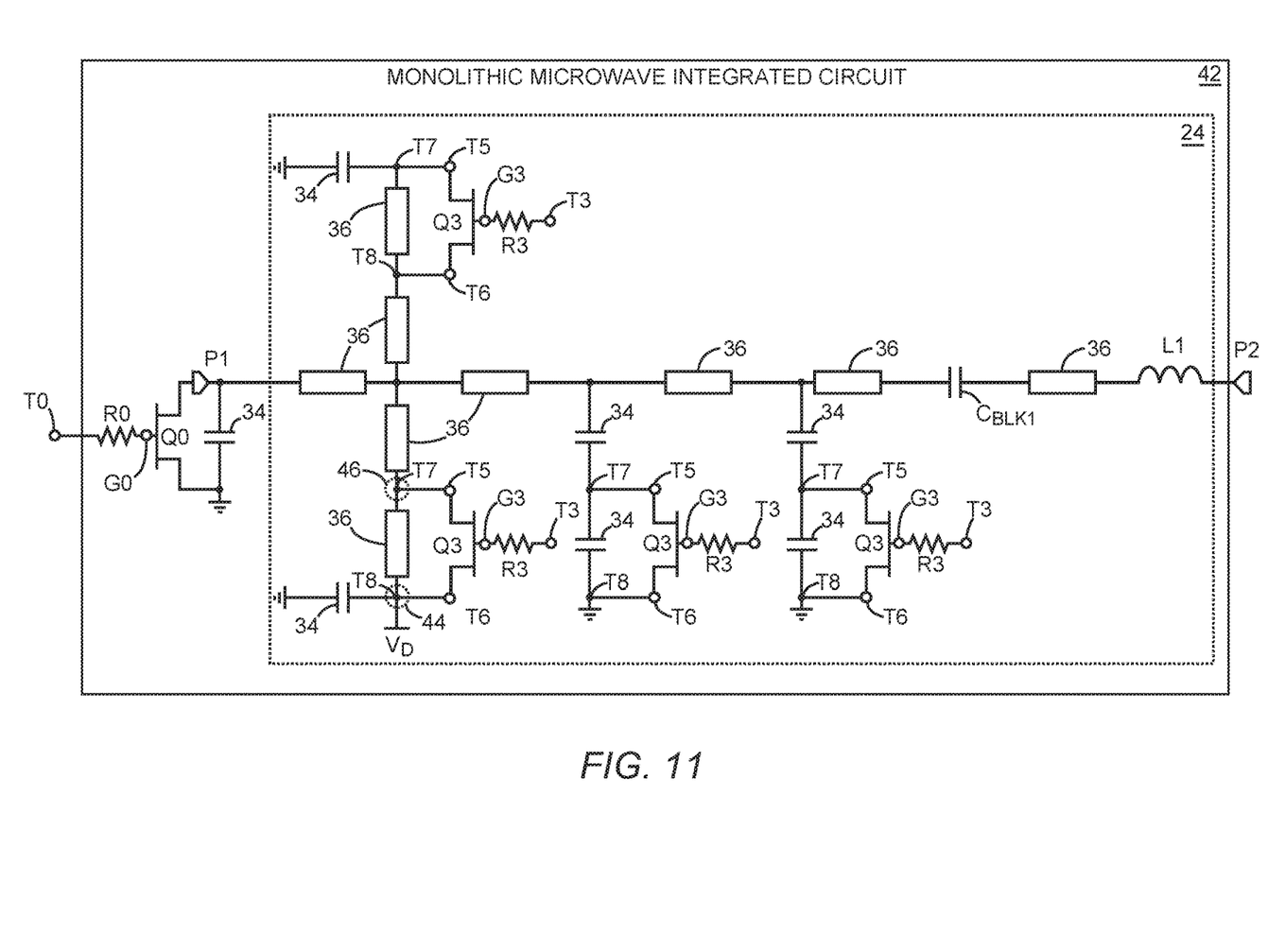
FIG. 11 is a schematic of a monolithic microwave integrated circuit that depicts an exemplary 25 watt version of an electronically reconfigurable matching network that is set up as a reconfigurable output matching network in accordance with the present disclosure.

FIG. 11 is a schematic of a monolithic microwave integrated circuit 42 that depicts an exemplary 25 watt version of the electronically reconfigurable matching network 24 that is set up as a reconfigurable output matching network in accordance with the present disclosure. A load target FET Q0 has an input terminal T0 that receives a RF signal. The input terminal T0 is coupled to a gate G0 through an input resistor R0. An amplified RF signal is then output from the load target FET Q0 to the first port P1. In this particular embodiment, the amplified RF signal propagates through a power path from the first port P1 through an inductor L1 and out the second port P2 to a 50 ohm (Ω) load (not shown). The load target FET Q0 is supplied by the on-chip drain voltage $V_D$. In this particular embodiment, the on-chip drain voltage $V_D$ is coupled to a node 44, but in other embodiments the on-chip drain voltage $V_D$ is coupled to a node 46. In some embodiments, the FET Q0 is GaN and in other embodiments the FET Q0 is gallium arsenide (GaAs). However, it is to be understood that the FET Q0 may be fabricated from other materials such as silicon.

In this exemplary embodiment, there are four individuals of the FET-based switch 32, each of which is represented by a single FET symbol. In this exemplary 25 watt version, the electronically reconfigurable matching network 24 matches a 50Ω efficiency tuned load, wherein the load target FET Q0 is a 7.2 mm periphery GaN FET operating with a drain voltage of $V_D$=25 V. Note that not all of the elements in this exemplary embodiment are required to be reconfigurable in order to meet desired specifications. Moreover, note that two drain bias circuits are used in parallel for current-handling considerations. The GaN FET is sized to produce 25 watts of output power at second port P2 with an assumed 0.6 dB of output matching network loss.

Figure 12:
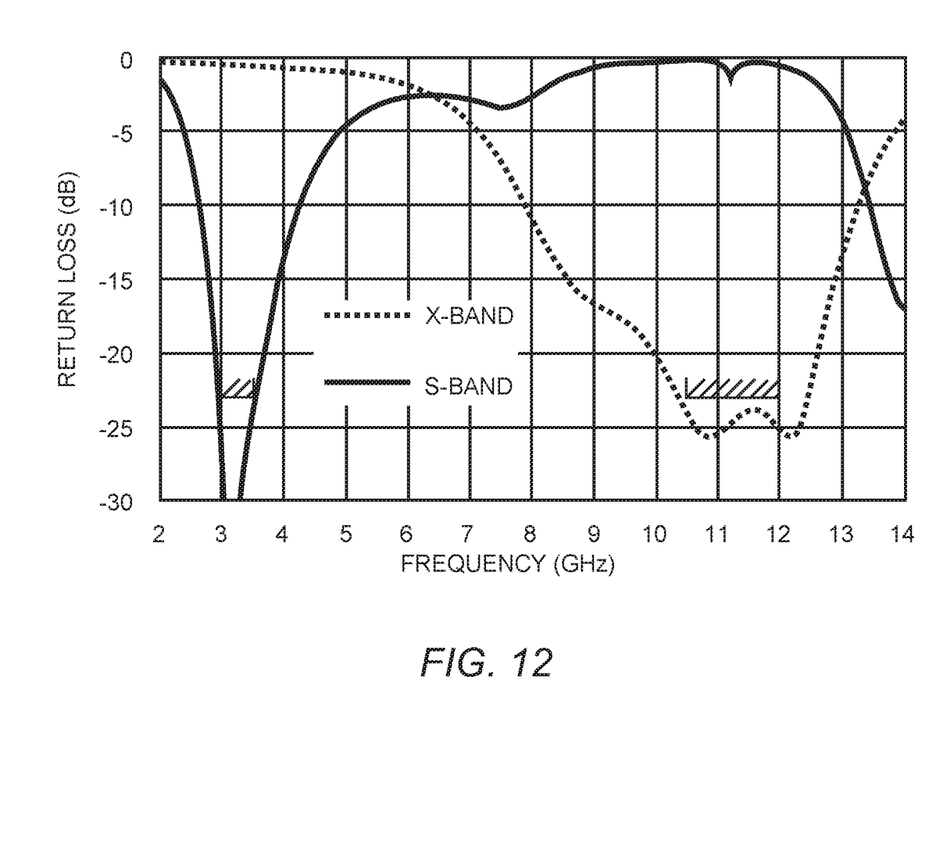
FIG. 12 is a graph of simulated return loss versus frequency with source impedance set to a resistive part of a load target with a shunt-connected capacitive part of the load target present for the exemplary 25 watt version of the electronically reconfigurable matching network of FIG. 11.
Figure 13:
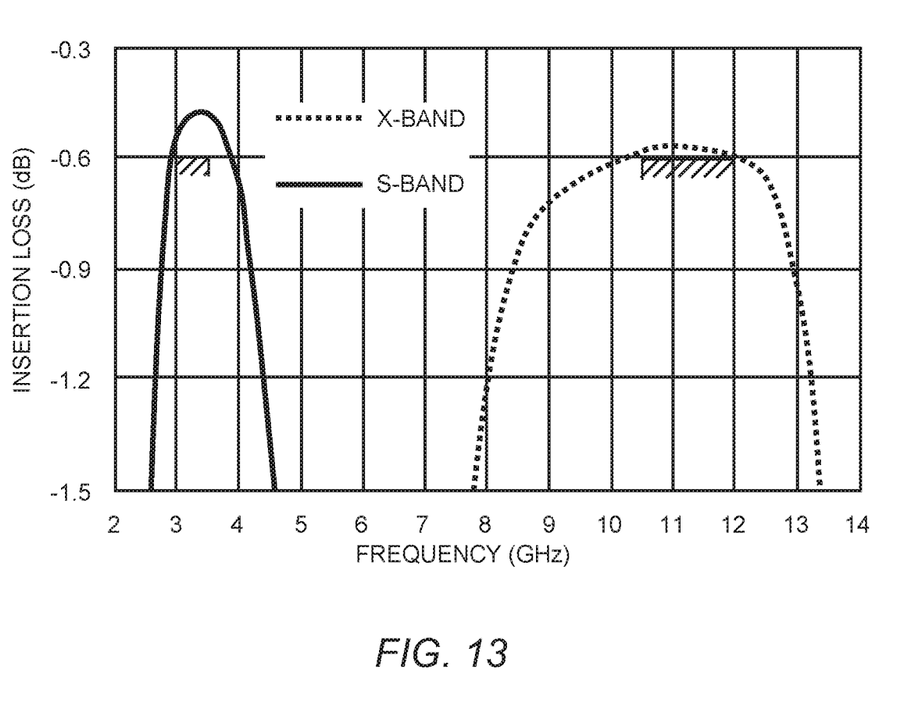
FIG. 13 is a graph of simulated insertion loss versus frequency for the exemplary 25 watt version of the electronically reconfigurable matching network of FIG. 11.

FIG. 12 is a graph of simulated return loss versus frequency for the exemplary 25 watt version of the electronically reconfigurable matching network of FIG. 11. FIG. 13 is a graph of simulated insertion loss versus frequency with source impedance set to a resistive part of the load target FET Q0 with a shunt-connected capacitive part of the load target FET Q0 present for the exemplary 25 watt version of the electronically reconfigurable matching network of FIG. 11. As illustrated, both the X-Band and the S-Band have less than 0.6 dB of matching network loss and are relatively very well matched to an output transistor load target.

Figure 14:
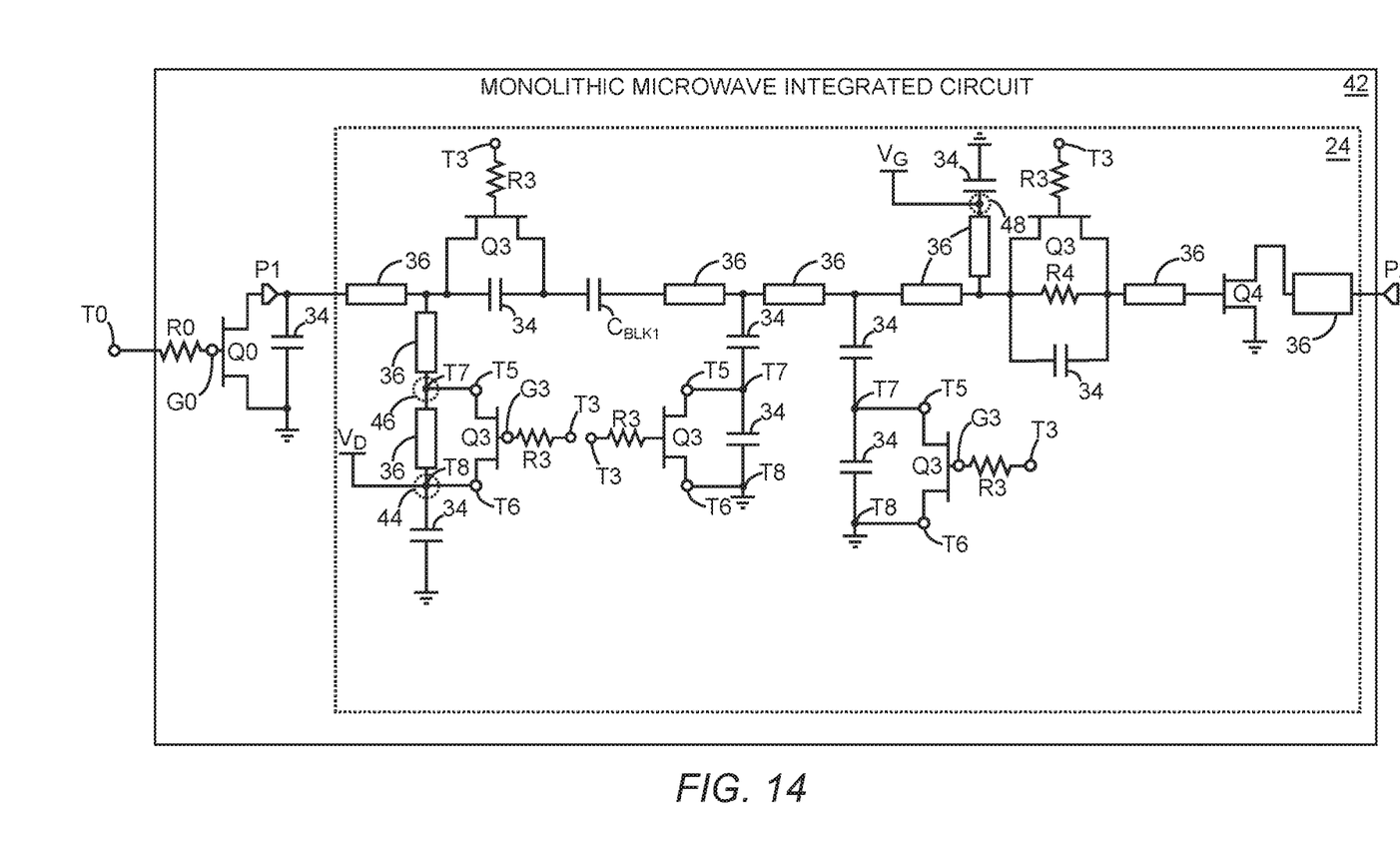
FIG. 14 is a schematic that depicts an exemplary 25 watt version of an electronically reconfigurable matching network that is set up as a reconfigurable interstage matching network in accordance with the present disclosure.

FIG. 14 is a schematic that depicts an exemplary 25 watt version of an electronically reconfigurable matching network 24 that is set up as a reconfigurable interstage matching network in accordance with the present disclosure. The electronically reconfigurable matching network 24 is configured to match input impedance of a FET output stage to an efficiency-tuned load of a driver transistor Q4 that is sized for a 4:1 staging ratio. In this exemplary case, an acceptable level of impedance matching performance is achievable by tuning only five of the plurality of electronically reconfigurable components 26. In this particular embodiment, the on-chip drain voltage $V_D$ is coupled to the node 46, but in other embodiments, such as the embodiment of FIG. 11, the on-chip drain voltage $V_D$ is coupled to a node 44. Moreover, in this particular embodiment, the on-chip gate voltage $V_G$ is coupled to a node 48.

Figure 15:
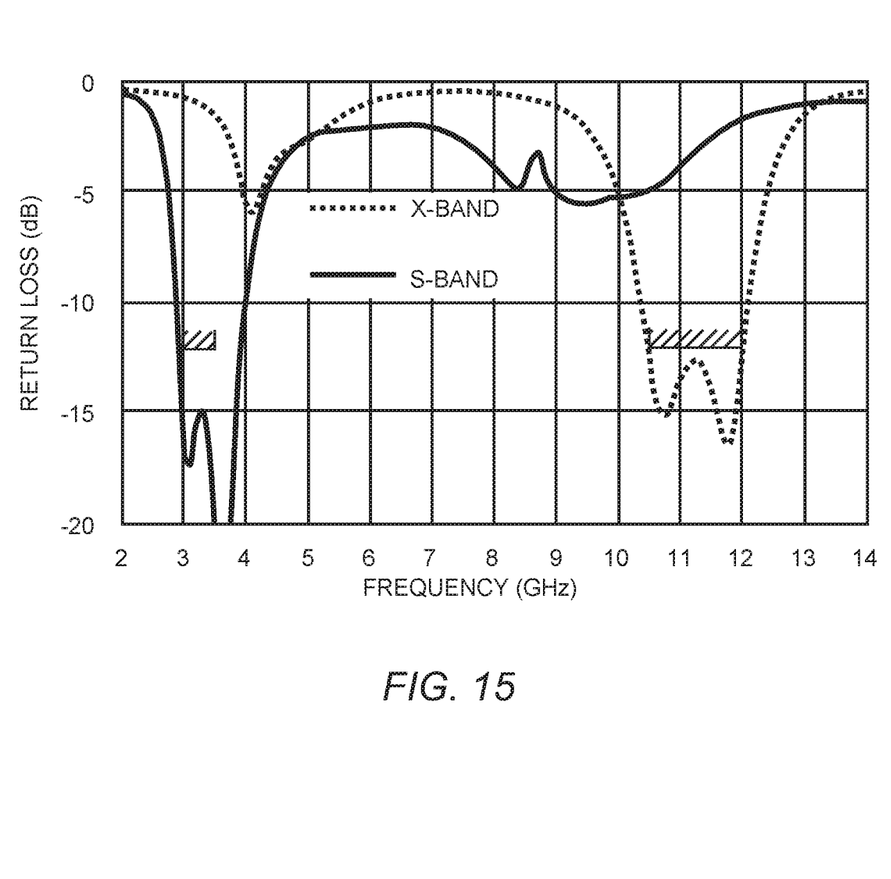
FIG. 15 is a graph of simulated return loss versus frequency for the exemplary 25 watt version of the electronically reconfigurable matching network of FIG. 14.

FIG. 15 is a graph of simulated return loss versus frequency for the exemplary 25 watt version of the electronically reconfigurable matching network 24 of FIG. 14. As shown in FIG. 15, the electronically reconfigurable matching network 24 provides a match that limits return loss to less than −12 dB. This degree of impedance matching performance is well within specification the desired bands of operation, which are designated by the diagonally hatched specification bars shown in FIG. 15.

Figure 16:
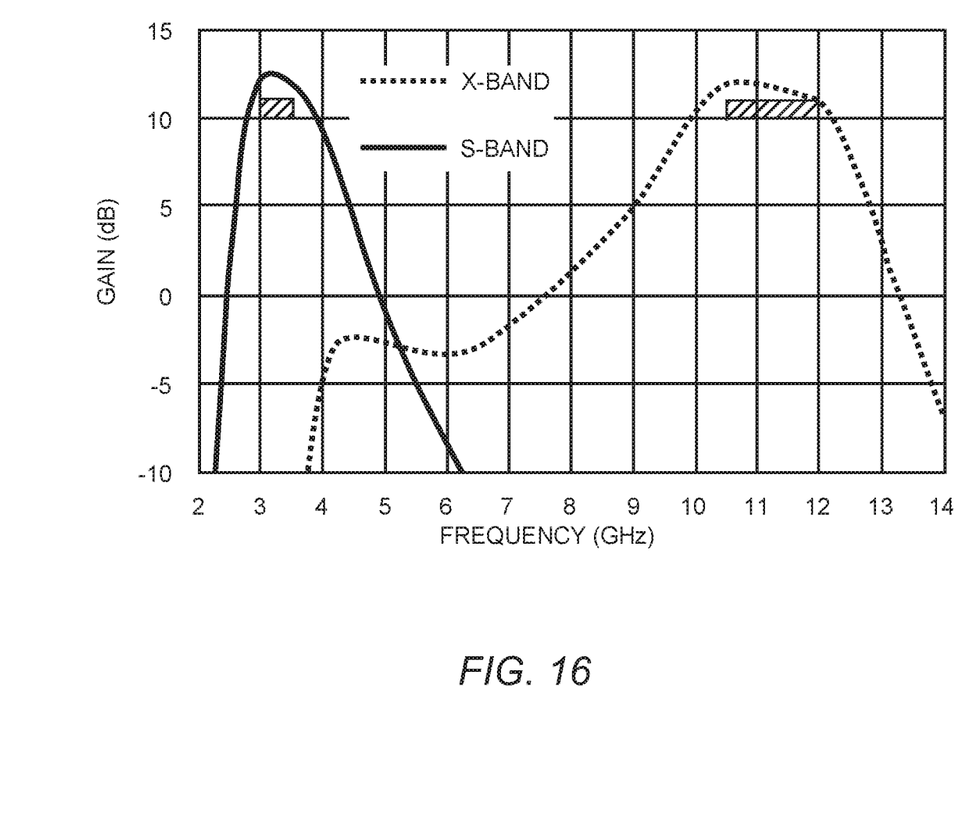
FIG. 16 is a graph of simulated gain versus frequency for the exemplary 25 watt version of the electronically reconfigurable matching network of FIG. 14.

FIG. 16 is a graph of simulated gain versus frequency with source impedance set to the resistive part of the load target FET Q0 with the shunt-connected capacitive part of the load target FET Q0 present and including the last stage FET Q4 for the exemplary 25 watt version of the electronically reconfigurable matching network 24 of FIG. 14. As depicted in FIG. 16, a linear gain of the electronically reconfigurable matching network 24 exceeds 11 dB for two bands of operation separated by at least 7.5 GHz. As such, at least 2-3 dB of drive margin is provided, assuming a 3 dB output stage compression level.

Those skilled in the art will recognize improvements and modifications to the preferred embodiments of the present disclosure. All such improvements and modifications are considered within the scope of the concepts disclosed herein and the claims that follow.

What is claimed is:

1. An electronically reconfigurable matching network comprising:
   a plurality of electronically reconfigurable components coupled to a power path between a first port and a second port, wherein each of the plurality of electronically reconfigurable elements comprises a plurality of selectable impedance elements coupled together, wherein each of the plurality of selectable impedance elements comprises:
   an impedance element coupled between a first end terminal and a second end terminal; and
   a field-effect transistor (FET)-based switch coupled between the first end terminal and the second end terminal and comprising:
   a first FET having a first current terminal, a first gate terminal, and a second current terminal coupled to the first gate terminal;
   a second FET having a third current terminal coupled to the first gate terminal, a fourth current terminal, and a second gate terminal coupled to a first control terminal; and
   a third FET having a fifth current terminal coupled to the first end terminal, a sixth current terminal coupled to the second end terminal, and a third gate terminal coupled to the third current terminal, wherein the first end terminal and the second end terminal are configured to receive a portion of radio frequency power from the power path.

2. The electronically reconfigurable matching network of claim 1 wherein the third FET is configured to provide an on-state that shunts the impedance element and an off-state that does not shunt the impedance element.

3. The electronically reconfigurable matching network of claim 2 wherein the first FET and the second FET provide a bias to the third gate terminal to ensure the on-state of the third FET as voltage across the first current terminal and the fourth current terminal varies between 0 V and 1 V.

4. The electronically reconfigurable matching network of claim 2 wherein the first FET and the second FET provide a bias to the third gate terminal to ensure the off-state of the third FET as voltage across the first current terminal and the fourth current terminal varies between −70 V and −15 V.

5. The electronically reconfigurable matching network of claim 2 wherein the first FET and the second FET provide a bias to the third gate terminal to ensure the on-state and the off-state of the third FET as voltage across the first current terminal and the fourth current terminal varies between −70 V and −15 V.

6. The electronically reconfigurable matching network of claim 1 wherein the impedance element is a capacitor.

7. The electronically reconfigurable matching network of claim 6 wherein the capacitor is a metal-insulator-metal type capacitor.

8. The electronically reconfigurable matching network of claim 1 wherein the impedance element is a distributed impedance element that includes resistance, capacitance, and inductance.

9. The electronically reconfigurable matching network of claim 8 wherein the distributed impedance element is a microstrip.

10. The electronically reconfigurable matching network of claim 1 wherein the impedance element is a resistor.

11. The electronically reconfigurable matching network of claim 10 wherein the resistor is a thin-film type resistor.

12. The electronically reconfigurable matching network of claim 1 wherein the third FET provides a tuning capacitance that comprises parasitic capacitance of the third FET in an off-state.

13. The electronically reconfigurable matching network of claim 1 wherein the third FET provides a tuning resistance that comprises channel resistance of the third FET in an on-state.

14. The electronically reconfigurable matching network of claim 13 wherein the third FET comprises an electronically tunable stability network coupled in series with the plurality of electronically reconfigurable components coupled in series in the power path.

15. The electronically reconfigurable matching network of claim 1 further including a first resistor coupled between the second current terminal and the third current terminal and a second resistor coupled between the third current terminal and the third gate terminal.

16. The electronically reconfigurable matching network of claim 1 further including at least one electronically reconfigurable component coupled between a fixed voltage node and at least one node between a pair of adjacent ones of the plurality of electronically reconfigurable components coupled in series in the power path.

17. The electronically reconfigurable matching network of claim 1 wherein the electronically reconfigurable matching network is integrated into a monolithic microwave integrated circuit (MMIC).

18. The electronically reconfigurable matching network of claim 17 wherein voltages applied to the first current terminal and the fourth current terminal during operation are on-chip voltages available to other circuitry integrated within the MMIC.

19. The electronically reconfigurable matching network of claim 17 further including a gallium nitride FET having a power output coupled to the first port of the power path.

20. The electronically reconfigurable matching network of claim 1 wherein the plurality of electronically reconfigurable components is configured to match an output impedance of a power amplifier coupled to the first port to a load impedance of a load coupled to the second port during a first operation at a first frequency and a second operation at a second frequency that is separated from the first frequency by at least one octave.

21. The electronically reconfigurable matching network of claim 1 wherein the plurality of electronically reconfigurable components is configured to match an output impedance of a power amplifier coupled to the first port to a load impedance of a load coupled to the second port during a first operation at S-band frequencies and a second operation at X-band frequencies.

22. The electronically reconfigurable matching network of claim 20 wherein the power path provides no more than 0.6 dB of matching loss during either the first operation within the S-band or the second operation within the X-band.

* * * * *